(12) United States Patent
Pai (10) Patent No.: US 7,388,409 B2
(45) Date of Patent: Jun. 17, 2008

(54) OFFSET INDEPENDENT SENSE CIRCUIT AND METHOD

(75) Inventor: Chung-Lung Pai, Taipei (TW)

(73) Assignee: Richtek Technology Corp., Hsinchu (TW)

( * ) Notice: Subject to any disclaimer, the term of this patent is extended or adjusted under 35 U.S.C. 154(b) by 0 days.

(21) Appl. No.: 11/882,639

(22) Filed: Aug. 3, 2007

(65) Prior Publication Data
US 2007/0273409 A1 Nov. 29, 2007

Related U.S. Application Data

(62) Division of application No. 11/166,134, filed on Jun. 27, 2005, now Pat. No. 7,274,219.

(30) Foreign Application Priority Data
Jun. 28, 2004 (TW) .............................. 93118877 A (51) Int. Cl.
*G01R 19/00* (2006.01)

(52) U.S. Cl. ......................................... 327/51; 327/56
(58) Field of Classification Search ................. 327/51, 327/53, 54, 56
See application file for complete search history.

(56) References Cited

U.S. PATENT DOCUMENTS

| 4,403,183 | A | * | 9/1983 | Lueker ....................... 324/72.5 |
| 4,424,486 | A | * | 1/1984 | Denton et al. .............. 324/225 |
| 5,367,212 | A | * | 11/1994 | Rabii .......................... 327/105 |
| 5,384,504 | A | * | 1/1995 | Dickinson et al. ........... 327/51 |
| 6,954,390 | B2 | * | 10/2005 | Baker ......................... 365/207 |

* cited by examiner

*Primary Examiner*—Kenneth B. Wells
(74) *Attorney, Agent, or Firm*—Rosenberg, Klein & Lee (57) ABSTRACT

An offset current independent sense circuit is switchable between a store state and a sense state. In the store state, the sense circuit stores an offset current to a capacitor, and the influence of the offset current is eliminated by a transistor to regenerate the offset current based on a signal provided by the capacitor in the sense state.

4 Claims, 13 Drawing Sheets

OFFSET INDEPENDENT SENSE CIRCUIT AND METHOD

RELATED CASES

This application is a Divisional patent application of application Ser. No. 11/166,134, filed 27 Jun. 2005, now U.S. Pat. No. 7,274,219.

FIELD OF THE INVENTION

The present invention is related generally to a sense circuit and method and more particularly to an offset independent sense circuit and method.

BACKGROUND OF THE INVENTION

Figure 1:
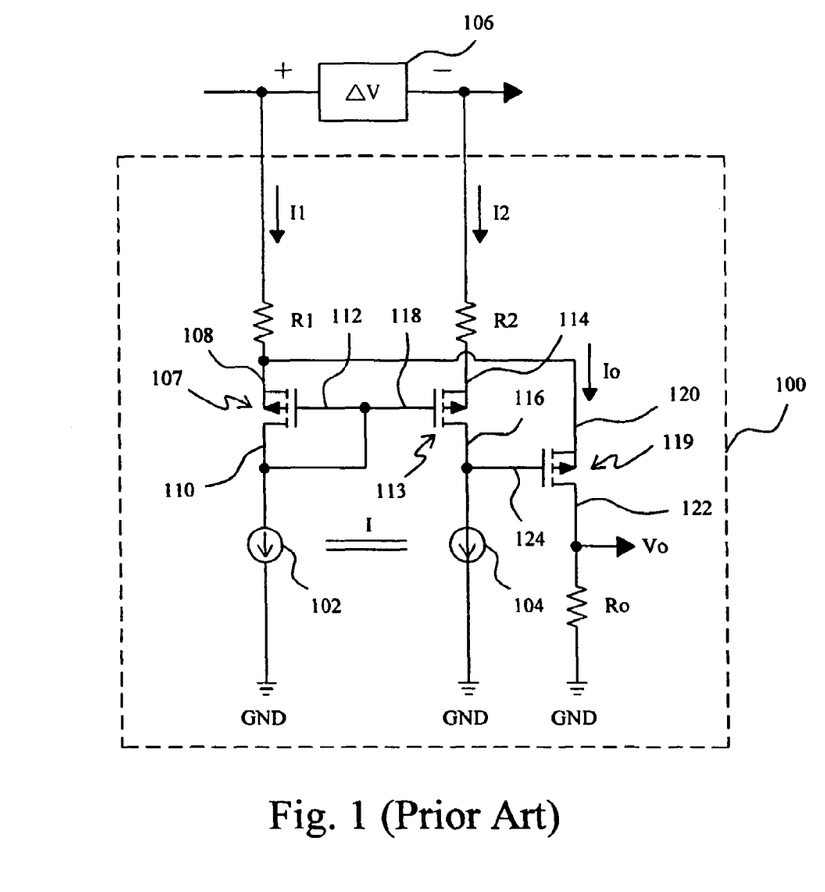
FIG. 1 shows a conventional sense circuit configured with a balance circuit for high-side sensing.

FIG. 1 shows a conventional sense circuit 100 configured with a balance circuit for high-side sensing, which comprises two resistors R1 and R2 connected to a sensed object 106 at the opposite sides, a transistor 107 having a source 108 connected to the resistor R1 and a drain 110 and gate 112 connected to a current source 102, a transistor 113 having a source 114 connected to the resistor R2, a gate 118 connected to the gate 112 of the transistor 107, and a drain 116 connected to a current source 104, a transistor 119 having a source 120 connected to the source 108 of the transistor 107, a gate 124 connected to the drain 116 of the transistor 113, and a drain 122 connected to a resistor $R_o$.

Based on the voltages at the opposite sides of the sensed object 106, two currents I1 and I2 flow through the resistors R1 and R2, respectively, and each of the currents provided by the current sources 102 and 104 is equal to the current I2. If the current I1 is larger than the current I2, the difference $I_o$ between the currents I1 and I2 will flow through the transistor 119 and resistor $R_o$ to produce an output voltage $V_o$, by which the voltage drop $\Delta V$ across the sensed object 106 is determined.

Figure 2:
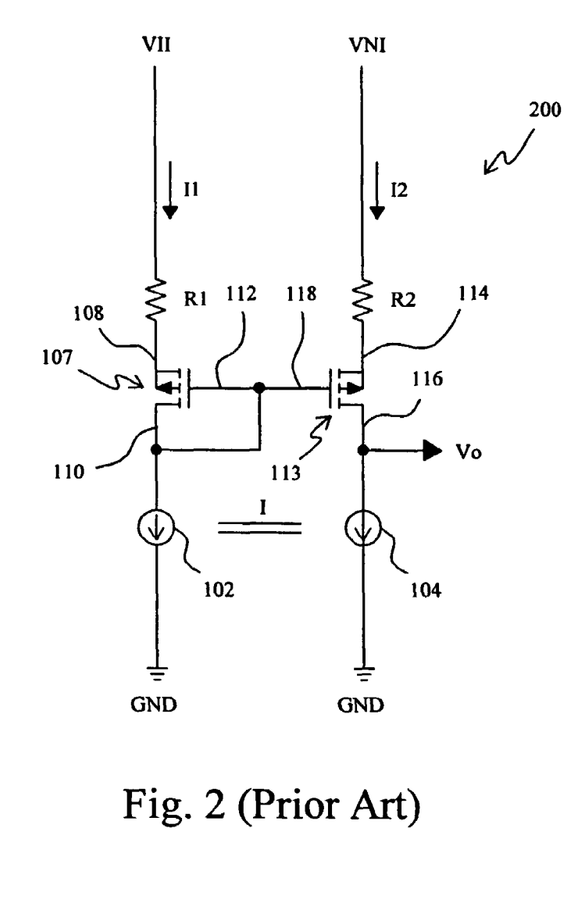
FIG. 2 shows a conventional sense circuit configured with a balance circuit for a comparator.

FIG. 2 shows a conventional sense circuit 200 configured with a balance circuit for a comparator, in which the balance circuit is the same as that of the sense circuit 100, and an output voltage $V_o$ is generated on the drain 116 of the transistor 113 in response to the difference between the input voltages VII and VNI connected to the resistors R1 and R2.

However, the real devices for the transistors 107 and 113 will not match to each other, and there is always an offset current present during the sensing carried out by the sense circuit 100 or 200. In other words, the sense circuits 100 and 200 never implement precise sensing. Though tuner circuit may be introduced to eliminate the influence caused by the offset current, proper tuning could not be achieved for sense circuits of mass production, since the sense circuits of mass production have not uniform offset currents.

Therefore, it is desired an offset independent sense circuit and method.

SUMMARY OF THE INVENTION

Accordingly, one object of the present invention is to provide an offset independent sense circuit and method.

In an offset independent sense circuit, according to the present invention, a balance circuit has a first and second inputs and a first and second outputs, a capacitor is connected to the first output, and a transistor is connected to the second output.

When a first voltage is switched to the first and second inputs, the sense circuit is switched to a store state, in which an offset current is produced at the first output and stored to the capacitor. When the first voltage and a second voltages are switched to the first and second inputs, respectively, the sense circuit is switched to a sense state, in which the transistor regenerates the offset current at the second output based on the signal provided by the capacitor, thereby eliminating the influence of the offset current.

Since the sense circuit of the present invention is capable of automatically eliminating the influence of the offset current, there will be not offset issue even for sense circuits of mass production.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 3A:
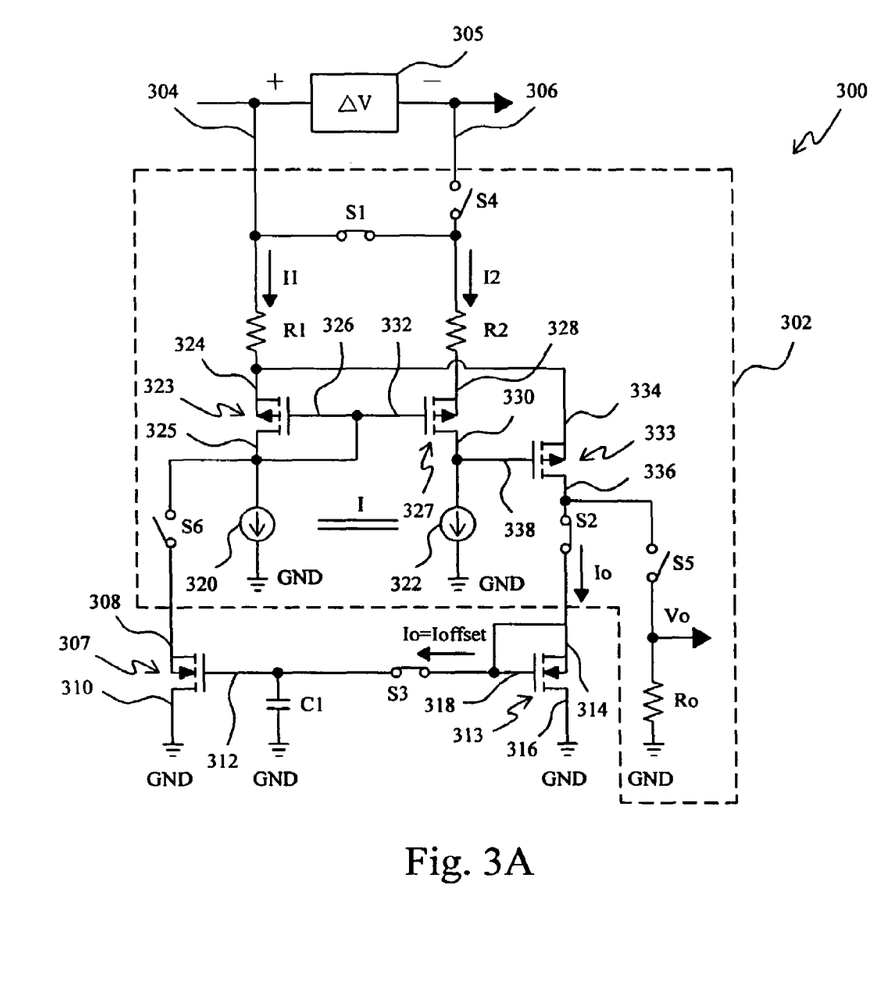
FIG. 3A and FIG. 3B show a sense circuit for high-side sensing in store state and sense state, respectively.
Figure 3B:
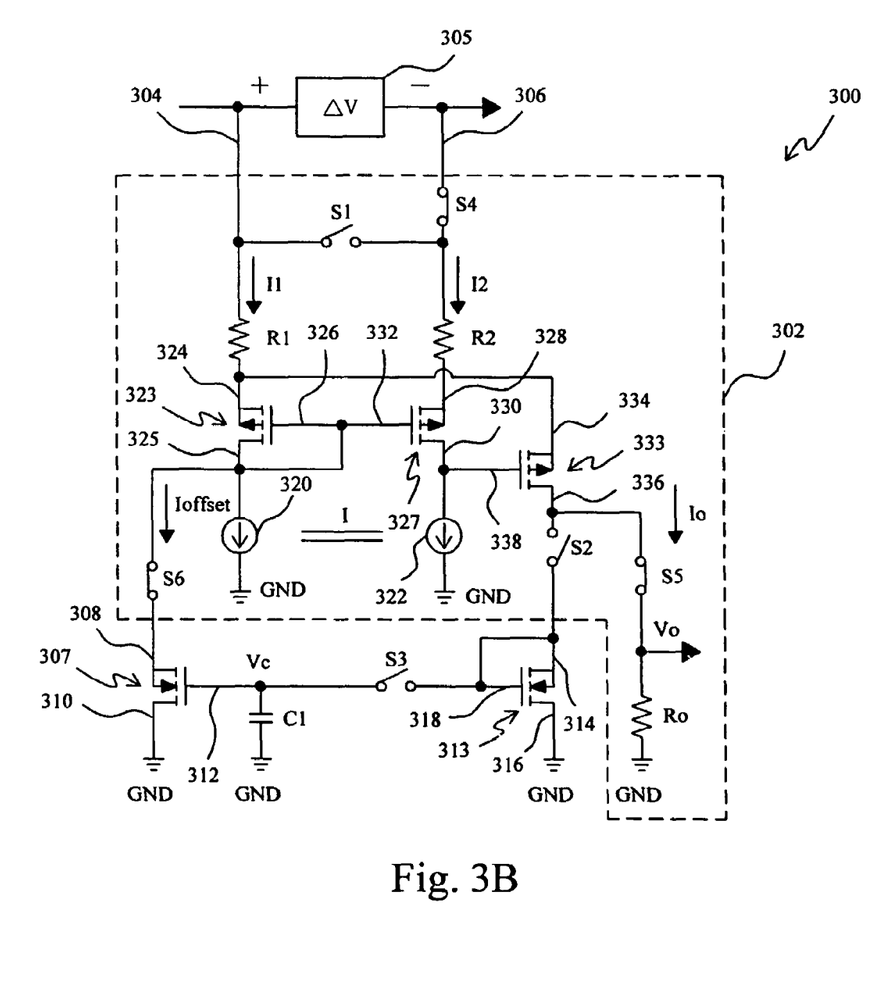

For an embodiment for high-side sensing, FIG. 3A and FIG. 3B show a sense circuit 300 in store state and sense state, respectively. In the sense circuit 300, a balance circuit 302 has two inputs 304 and 306 connected to the opposite sides of a sensed object 305, a transistor 307 has a source 308 connected to the balance circuit 302, a drain 310 is grounded, and a gate 312 connected to a capacitor C1, the capacitor C1 has the other terminal grounded, and a transistor 313 has a source 314 and gate 318 connected to the balance circuit 302 and capacitor C1, and a drain 316 grounded.

In the balance circuit 302, a resistor R1 is connected between the input 304 and a transistor 323, a resistor R2 is connected between the input 306 and a transistor 327, the transistor 323 has its source 324 connected to the resistor R1, and its drain 325 and gate 326 connected to a current source 320 and the source 308 of the transistor 307, the transistor 327 has its source 328 connected to the resistor R2, its gate 332 connected to the gate 326 of the transistor 323, and its drain 330 connected to a current source 322, a transistor 333 has its source 334 connected to the source 324 of the transistor 323, its gate 338 connected to the drain 330 of the transistor 327, and its drain 336 connected to a resistor RO and the source 314 of the transistor 313.

In the sense circuit 300, switches S1-S6 are used to switch the sense circuit 300 between the store state and sense state under the control of a clock. The switch S1 is between the inputs 304 and 306, the switch S2 is between the transistors 333 and 313, the switch S3 is between the gate 318 of the transistor 313 and the capacitor C1, the switch S4 is between the input 306 and resistor R2, the switch S5 is between the transistor 333 and resistor $R_o$, and the switch S6 is between the transistors 323 and 307. In this embodiment, to determine the direction of the offset current $I_{offset}$ to be operated, the transistor 327 is smaller than the transistor 323, or the resistor R2 is larger than the resistor R1.

Referring to FIG. 3A, when the switches S1-S3 turn on and the switches S4-S6 turn off, the sense circuit 300 is switched to the store state, and the voltage on the input 304 is applied to the resistors R1 and R2. Due to the transistor 327 smaller than the transistor 323, or the resistor R2 larger than the resistor R1, the current I1 flowing through the resistor R1 is larger than the current I2 flowing through the resistor R2. Moreover, each of the currents provided by the current sources 320 and 322 is equal to the current I2, and therefore the output current $I_o$ flowing through the transistor 333 is equal to the difference between the currents I1 and I2. This output current $I_o$ is the offset current $I_{offset}$. Since the switch S2 turns on and the switch S5 turns off, the offset current $I_{offset}$ is stored to the capacitor C1 by charging the capacitor C1. Referring to FIG. 3B, when the switches S1-S3 turn off and the switches S4-S6 turn on, the sense circuit 300 is switched to the sense state, and the capacitor C1 applies a signal $V_c$ based on the offset current $I_{offset}$ it has stored in the store state to the gate 312 of the transistor 307, by which the transistor 307 conducts a current as large as the offset current $I_{offset}$, thereby eliminating the influence of the offset current $I_{offset}$.

Figure 4:
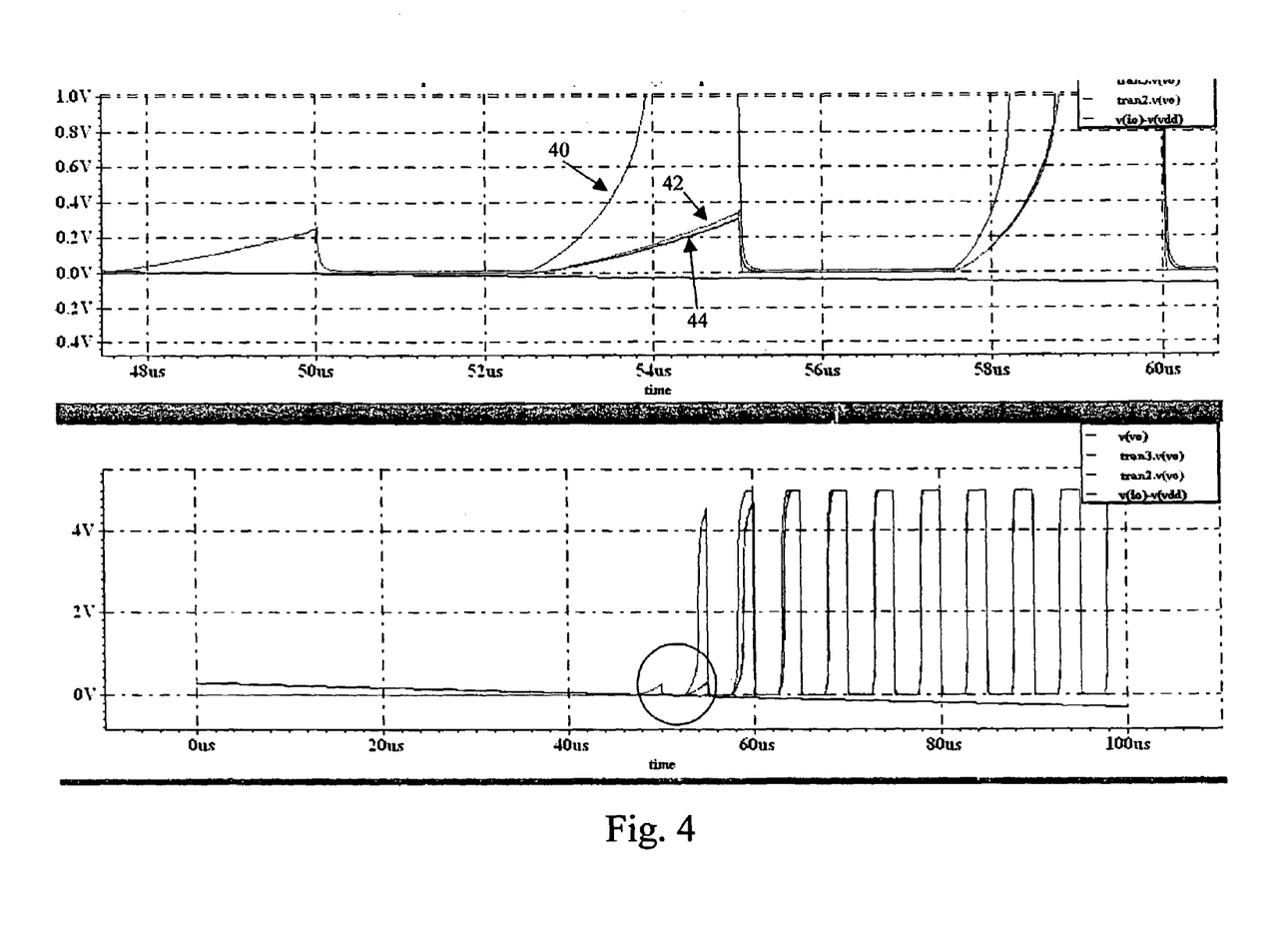
FIG. 4 shows simulated waveforms generated by various sense circuits.

FIG. 4 shows simulated waveforms generated by various sense circuits, in which the upper panel is an enlargement of the circle in the lower panel. Waveform 40 represents the output voltage of the conventional sense circuit 100, waveform 42 represents the output voltage of the sense circuit 300, and waveform 44 represents the output voltage of an ideal sense circuit without offset current. FIG. 4 shows that the sense circuit 300 is almost not influenced by offset current.

Figure 5A:
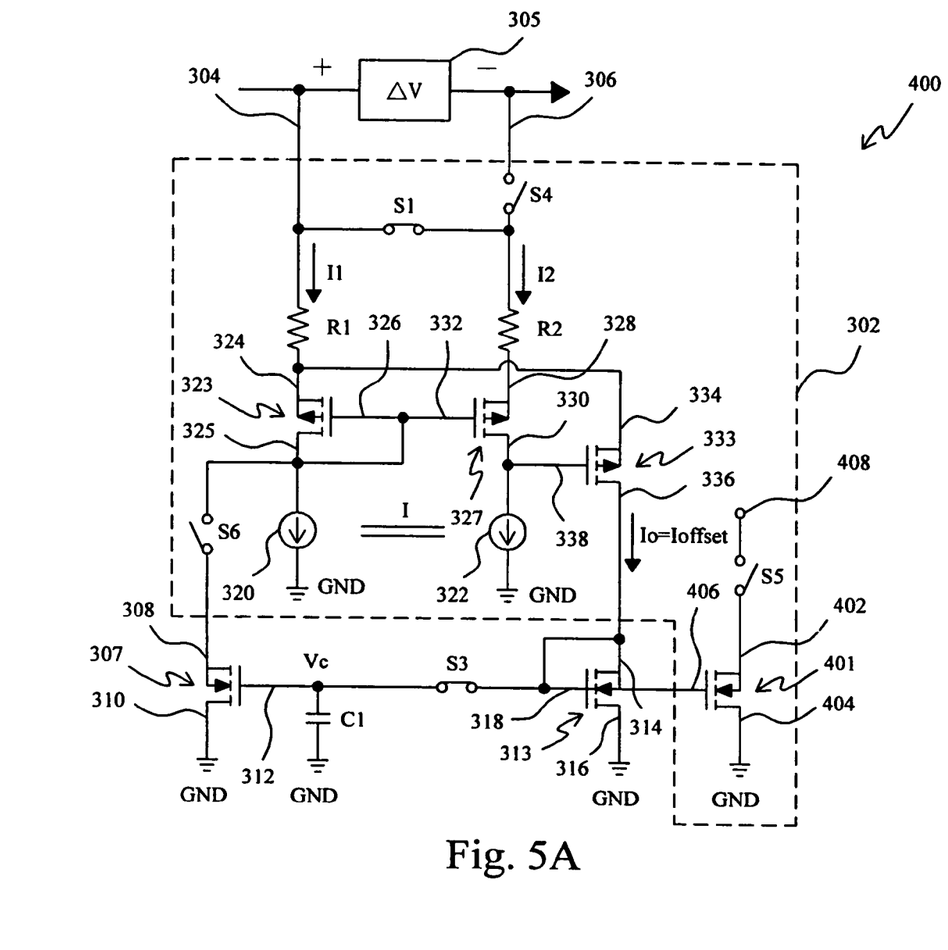
FIG. 5A and FIG. 5B show another sense circuit for high-side sensing in store state and sense state, respectively.
Figure 5B:
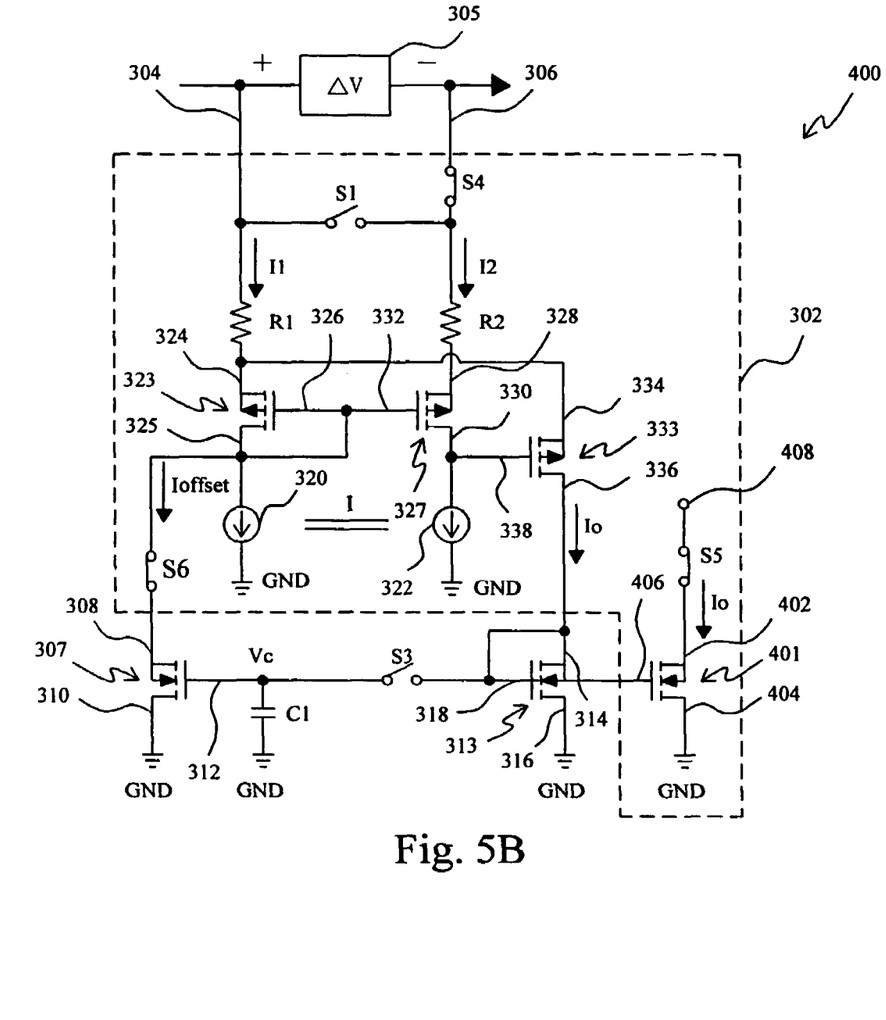

For another embodiment for high-side sensing, FIG. 5A and FIG. 5B show a sense circuit 400 in store state and sense state, respectively. The sense circuit 400 is almost the same as the sense circuit 300, only that the switch S2 is removed and a transistor 401 replaces the role of the resistor $R_o$ in the sense circuit 300. The transistor 401 has its gate 406 connected to the gate 318 of the transistor 313 to form a current mirror, the source 402 of the transistor 401 is connected to the output 408 of the sense circuit 400 through the switch S5, and the drain of the transistor 401 is grounded. Referring to FIG. 5A, when the switches S1 and S3 turn on and the switches S4-S6 turn off, the sense circuit 400 is switched to the store state, and the output current $I_o$ is the offset current $I_{offset}$ and is stored to the capacitor C1 by charging the capacitor C1. Referring to FIG. 5B, when the switches S1 and S3 turn off and the switches S4-S6 turn on, the sense circuit 400 is switched to the sense state, and the capacitor C1 applies a signal $V_c$ based on the offset current $I_{offset}$ it has stored in the store state to the gate 312 of the transistor 307, by which the transistor 307 conducts a current as large as the offset current $I_{offset}$, thereby eliminating the influence of the offset current $I_{offset}$. On the other hand, the output current $I_o$ is mirrored by the current mirror composed of the transistors 313 and 401 to the output 408 of the sense circuit 400.

Figure 6A:
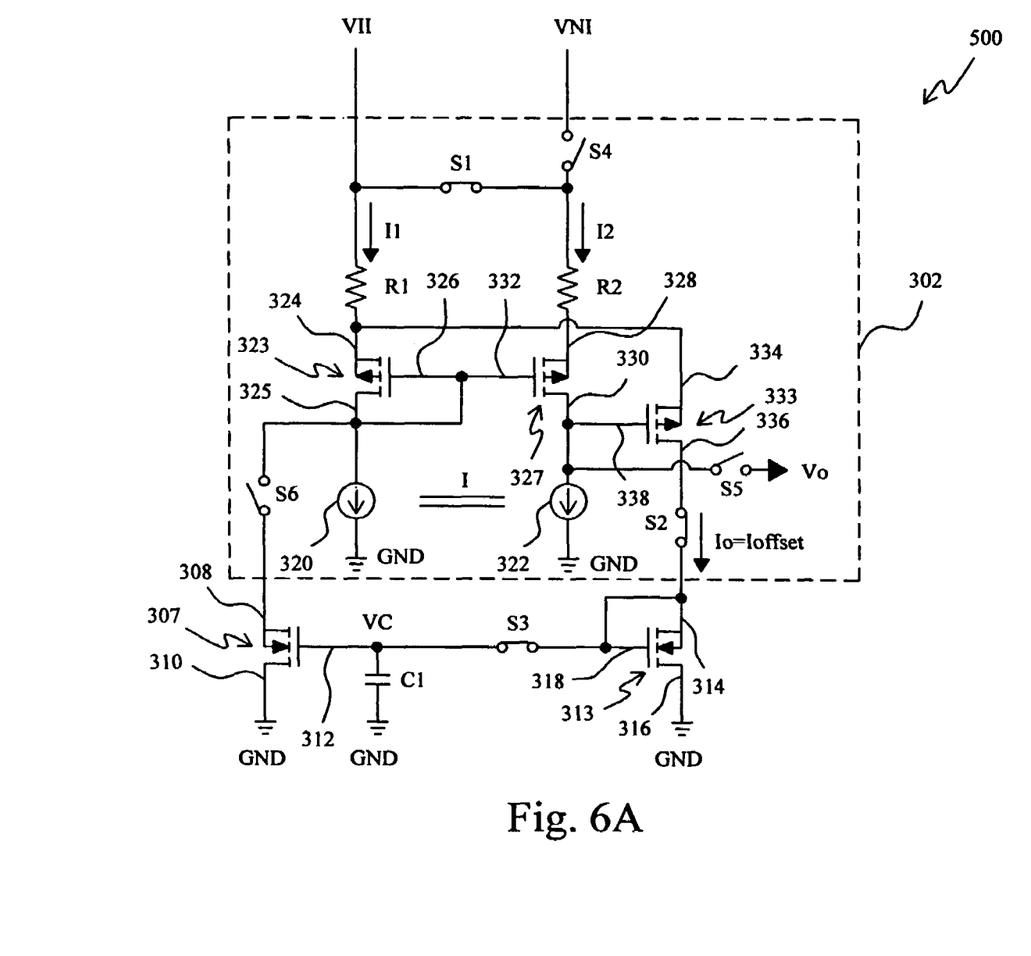
FIG. 6A and FIG. 6B show a sense circuit for a high-side comparator in store state and sense state, respectively.
Figure 6B:
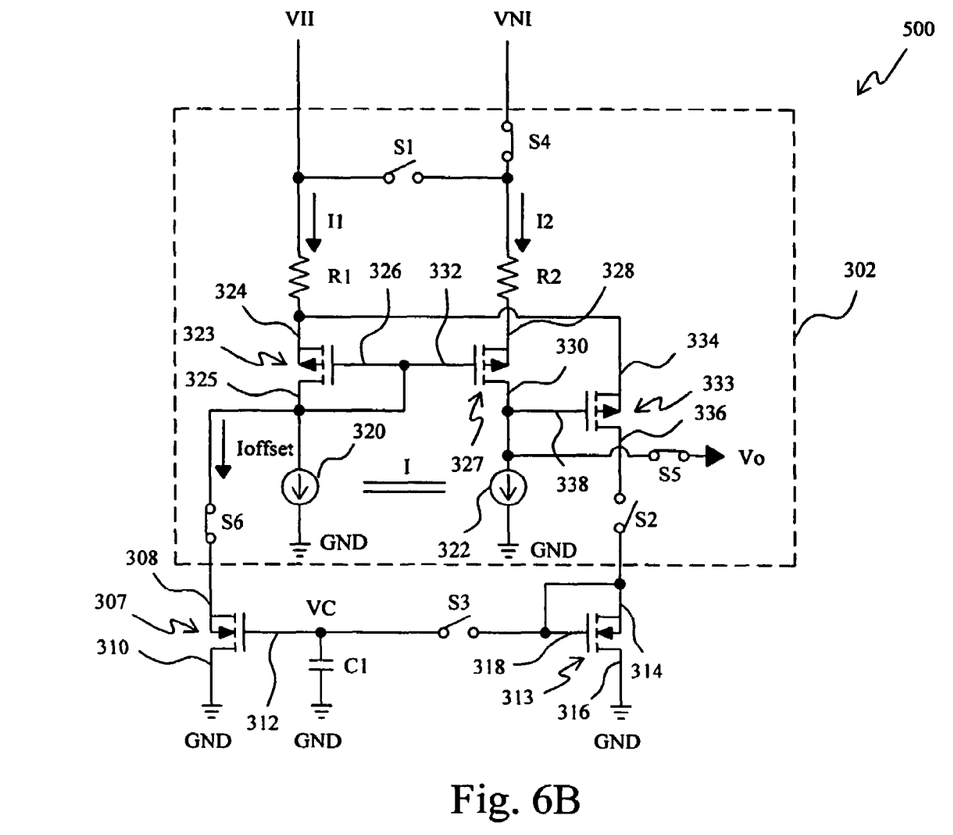

For an embodiment for a high-side comparator, FIG. 6A and FIG. 6B show a sense circuit 500 in store state and sense state, respectively. The sense circuit 500 is connected with two voltages VII and VNI and is almost the same as the sense circuit 300, only that the resistor $R_o$ of the sense circuit 300 is removed, and the switch S5 and output $V_o$ of the sense circuit 500 are connected to the drain 330 of the transistor 327. Referring to FIG. 6A, when the switches S1-S3 turn on and the switches S4-S6 turn off, the sense circuit 500 is switched to the store state, and the output current $I_o$ is the offset current $I_{offset}$ and is stored to the capacitor C1. Referring to FIG. 6B, when the switches S1-S3 turn off and the switches S4-S6 turn on, the sense circuit 500 is switched to the sense state, and the capacitor C1 applies a signal $V_c$ based on the offset current $I_{offset}$ it has stored in the store state to the gate 312 of the transistor 307, by which the transistor 307 conducts a current as large as the offset current $I_{offset}$, thereby eliminating the influence of the offset current $I_{offset}$. On the other hand, the output current $I_o$ is mirrored by the current mirror composed of the transistors 313 and 401 to the output 408 of the sense circuit 400.

Figure 7A:
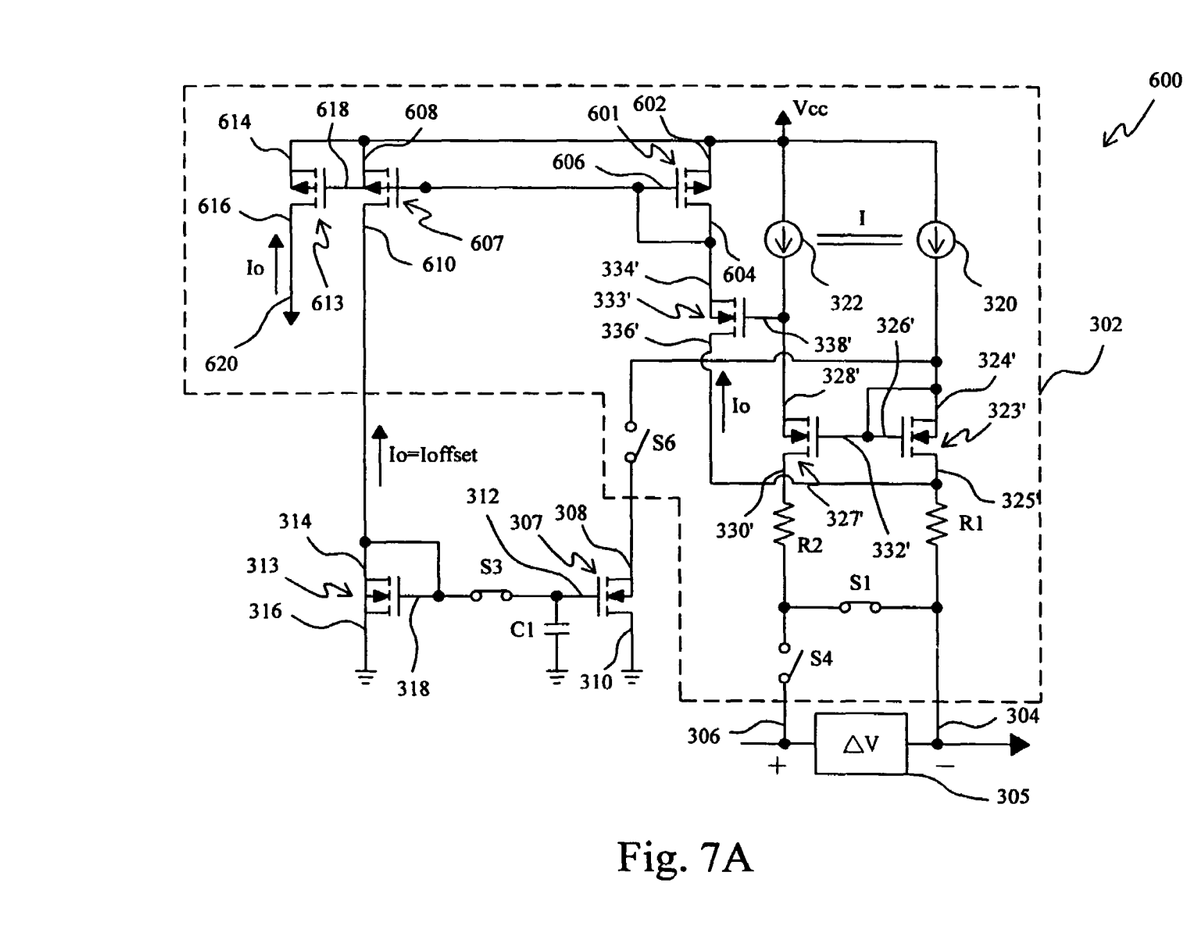
FIG. 7A and FIG. 7B show a sense circuit for low-side sensing in store state and sense state, respectively.
Figure 7B:
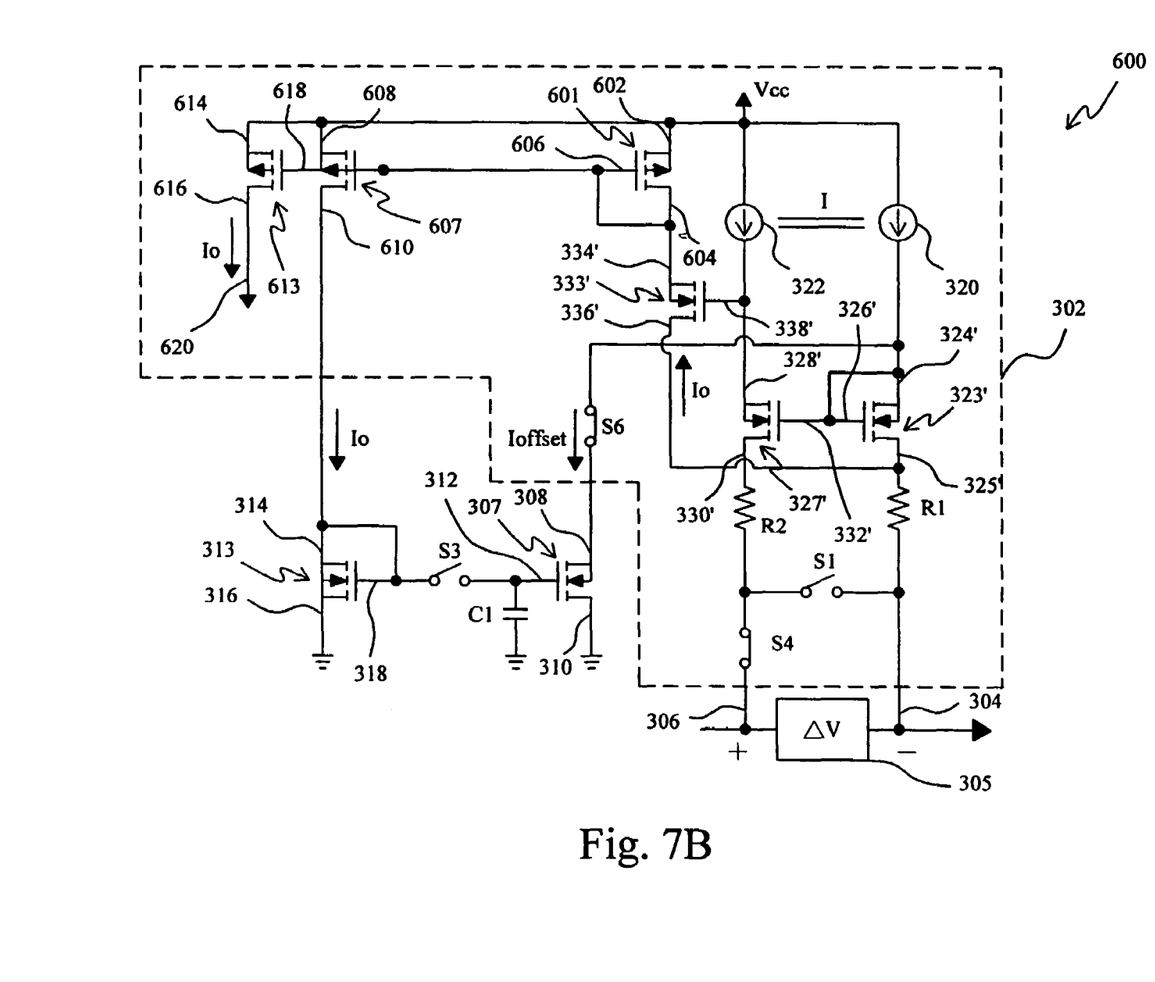

For an embodiment for low-side sensing, FIG. 7A and FIG. 7B show a sense circuit 600 in store state and sense state, respectively. In the sense circuit 600, a balance circuit 302 has two inputs 304 and 306 connected to the opposite sides of a sensed object 305, a transistor 307 has a source 308 connected to the balance circuit 302, a drain 310 is grounded, and a gate 312 connected to a capacitor C1, the capacitor C1 has the other terminal grounded, and a transistor 313 has a source 314 and gate 318 connected to the balance circuit 302 and capacitor C1, and a drain 316 grounded. In the balance circuit 302, a resistor R1 is connected between the input 304 and a transistor 323', a resistor R2 is connected between the input 306 and a transistor 327', the transistor 323' has its source 324' and gate 326' connected to a current source 320 and the source 308 of the transistor 307, and its drain 325' connected to the resistor R1, the transistor 327' has its source 328' connected to a current source 322, its gate 332' connected to the gate 326' of the transistor 323', and its drain 330 connected to the resistor R2, a transistor 333' has its source 334' connected to a transistor 601, its gate 338' connected to the drain 328' of the transistor 327', and its drain 336' connected to the drain 325' of the transistor 323', the transistor 601 has its source 602 connected to a supply voltage $V_{cc}$, and its drain 604 and gate 606 connected to the source 334' of the transistor 333', a transistor 607 is connected to the transistor 606 to form a first current mirror, a transistor 613 is connected to the transistor 607 to form a second current mirror, the transistor 607 has its source 608 connected to the supply voltage $V_{cc}$, its drain 610 connected to the source 314 of the transistor 313, and the transistor 613 has its source 614 connected to the supply voltage $V_{cc}$ and its drain 616 connected to the output of the sense circuit 600.

A switch S1 is between the inputs 304 and 306, a switch S3 is between the gate 318 of the transistor 313 and the capacitor C1, a switch S4 is between the input 306 and resistor R2, and a switch S6 is between the transistors 323' and 307. Those switches S1, S3, S4 and S6 are controlled by a clock to switch the sense circuit 600 between the store state and sense state. In this embodiment, to determine the direction of the offset current $I_{offset}$ to be operated, the transistor 327' is smaller than the transistor 323', or the resistor R2 is larger than the resistor R1. Referring to FIG. 7A, when the switches S1 and S3 turn on and the switches S4 and S6 turn off, the sense circuit 600 is switched to the store state, and the current $I_o$ flowing through the transistor 333' is the offset current $I_{offset}$ and is mirrored by the first current mirror composed of the transistors 601 and 607 to the transistor 313 to store to the capacitor C1. Referring to FIG. 7B, when the switches S1 and S3 turn off and the switches S4 and S6 turn on, the sense circuit 600 is switched to the sense state, and the capacitor C1 applies a signal $V_c$ based on the offset current $I_{offset}$ it has stored in the store state to the gate 312 of the transistor 307, by which the transistor 307 conducts a current as large as the offset current $I_{offset}$, thereby eliminating the influence of the offset current $I_{offset}$.

Figure 8A:
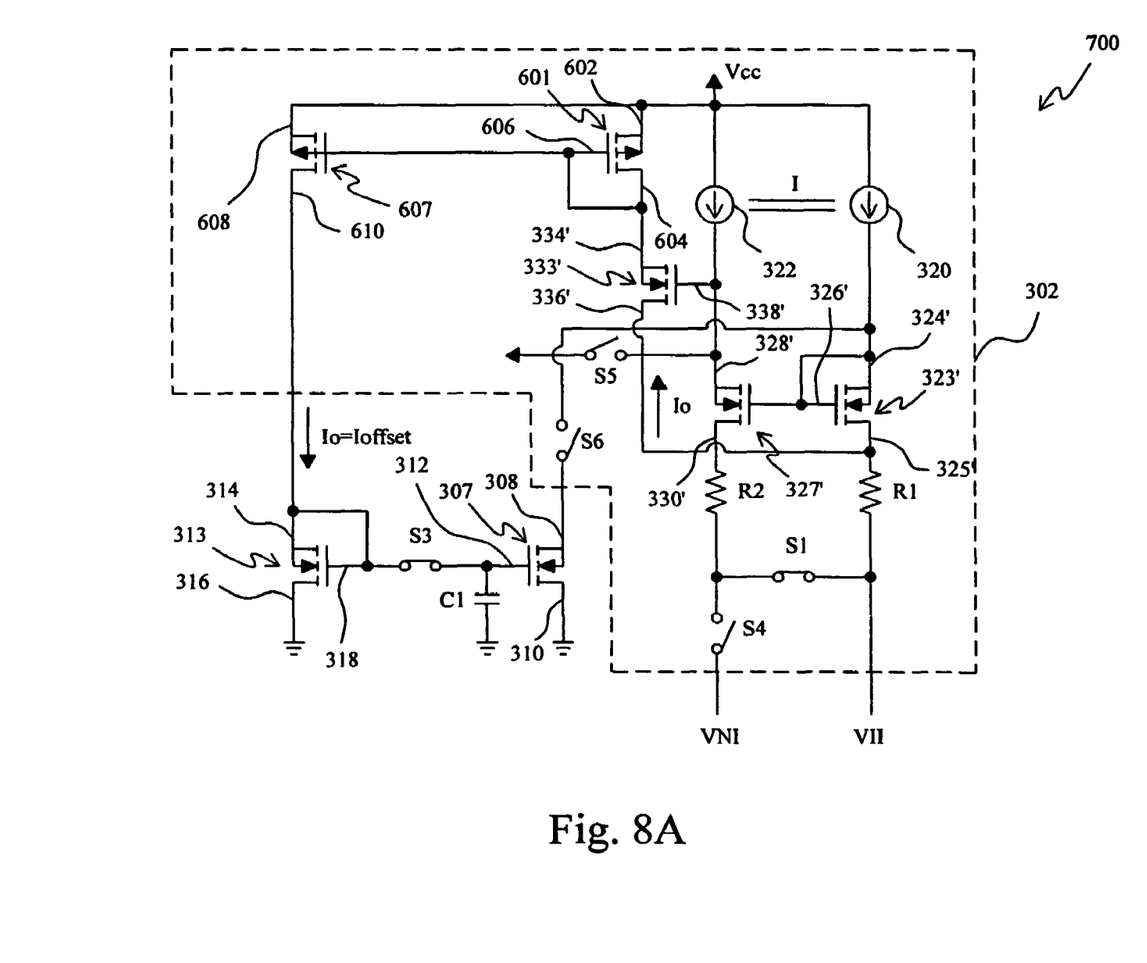
FIG. 8A and FIG. 8B show a sense circuit low-side comparator in store state and sense state, respectively.
Figure 8B:
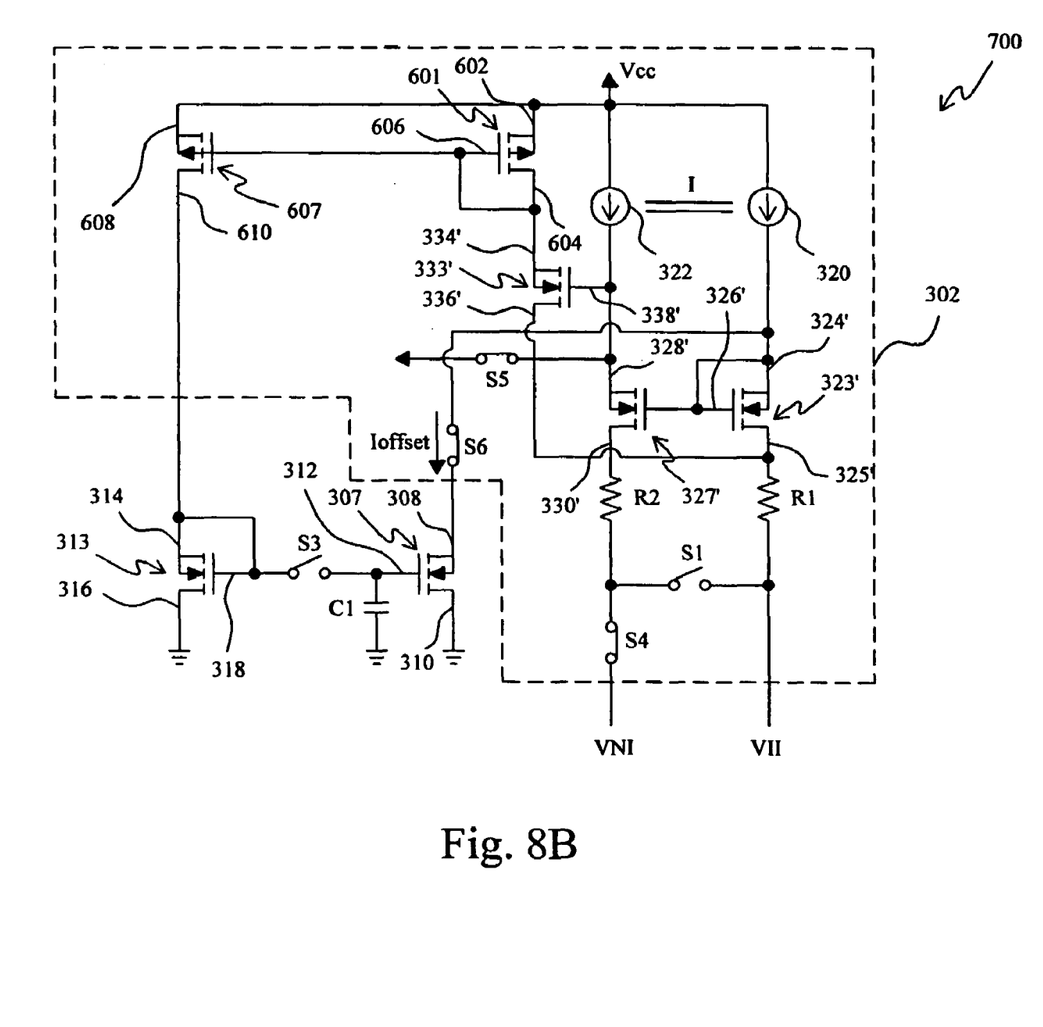

For an embodiment for a low-side comparator, FIG. 8A and FIG. 8B show a sense circuit 700 in store state and sense state, respectively. The sense circuit 700 is connected with two voltages VII and VNI and is almost the same as the sense circuit 600, only that the transistor 607 of the sense circuit 600 is removed, and a switch S5 and output $V_o$ of the sense circuit 700 are connected to the source 328' of the transistor 327'. Referring to FIG. 8A, when the switches S1 and S3 turn on and the switches S4-S6 turn off, the sense circuit 700 is switched to the store state, and the output current lo is the offset current $I_{offset}$ and is mirrored by the current mirror composed of the transistors 601 and 607 to the transistor 313 to store to the capacitor C1. Referring to FIG. 8B, when the switches S1 and S3 turn off and the switches S4-S6 turn on, the sense circuit 700 is switched to the sense state, and the capacitor C1 applies a signal $V_c$ based on the offset current $I_{offset}$ it has stored in the store state to the gate 312 of the transistor 307, by which the transistor 307 conducts a current as large as the offset current $I_{offset}$, thereby eliminating the influence of the offset current $I_{offset}$.

The MOS transistors in the embodiments of FIGS. 3-8 may be replaced with bipolar transistors.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An offset independent sense circuit comprising:
   a balance circuit, having a first and second inputs and a first and second outputs, operative to produce an offset current at the first output when a first voltage is switched to the first and second inputs;
   a capacitor, connected to the first output, for storing the offset current;
   a first transistor, connected to the second output, operative to regenerate the offset current at the second output based on a signal provided by the capacitor when the first voltage and a second voltage are switched to the first and second inputs, respectively and,
   a second transistor connected between the first output and the capacitor;
   wherein the balance circuit comprises:
   a first current source, connected to the second output, for providing a first current;
   a second current source for providing a second current as large as the first current;
   a third transistor connected to the second output;
   a first resistor connected between the first input and third transistor;
   a current mirror having a reference branch connected between the first resistor and third transistor, and a mirror branch connected to the first output;
   a fourth transistor, connected to the second current source, for conducting a third current; and
   a second resistor connected between the second input and fourth transistor.

2. The sense circuit of claim 1, wherein the third and fourth transistors are MOS transistors.

3. The sense circuit of claim 1, wherein the third and fourth transistors are bipolar transistors.

4. The sense circuit of claim 1, further comprising:
   a first switch connected between the first and second inputs;
   a second switch connected between the second transistor and capacitor;
   a third switch connected between the second input and second resistor; and
   a fourth switch connected between the second output and first transistor.

* * * * *